United States Patent
Yen et al.

(10) Patent No.: US 7,601,404 B2
(45) Date of Patent: Oct. 13, 2009

(54) METHOD FOR SWITCHING DECOUPLED PLASMA NITRIDATION PROCESSES OF DIFFERENT DOSES

(75) Inventors: Ying-Wei Yen, Miao-Li Hsien (TW); Yun-Ren Wang, Tai-Nan (TW); Shu-Yen Chan, Hsin-Chu Hsien (TW); Chen-Kuo Chiang, Tainan Hsien (TW); Chung-Yih Chen, Tai-Nan (TW)

(73) Assignee: United Microelectronics Corp., Hsin-Chu (TW)

( * ) Notice: Subject to any disclaimer, the term of this patent is extended or adjusted under 35 U.S.C. 154(b) by 519 days.

(21) Appl. No.: 11/160,108

(22) Filed: Jun. 9, 2005

(65) Prior Publication Data

US 2006/0280876 A1  Dec. 14, 2006

(51) Int. Cl.
*B05D 3/02* (2006.01)
*C23C 16/34* (2006.01)

(52) U.S. Cl. .............. 427/569; 427/255.29; 427/314; 438/775

(58) Field of Classification Search ........... 427/569, 427/255.29, 314; 438/5, 308, 775
See application file for complete search history.

(56) References Cited

U.S. PATENT DOCUMENTS

| | | | |
|---|---|---|---|
| 6,310,367 B1 * | 10/2001 | Yagishita et al. | 257/190 |
| 6,406,978 B1 | 6/2002 | Yang | |
| 6,426,305 B1 * | 7/2002 | Chou et al. | 438/758 |
| 6,566,205 B1 * | 5/2003 | Yu et al. | 438/287 |
| 6,780,720 B2 * | 8/2004 | Burnham et al. | 438/287 |
| 6,830,996 B2 * | 12/2004 | Chen et al. | 438/585 |
| 6,867,084 B1 * | 3/2005 | Chiu et al. | 438/216 |
| 6,998,153 B2 * | 2/2006 | Chiang et al. | 427/255.11 |
| 7,056,773 B2 * | 6/2006 | Bryant et al. | 438/142 |
| 2003/0073247 A1 | 4/2003 | Lin et al. | |

(Continued)

FOREIGN PATENT DOCUMENTS

CN  1617297 A  5/2005

(Continued)

OTHER PUBLICATIONS

Tan, Shyue Seng, et al., "Mechanism of nitrogen-enhanced negative bias temperature instability in pMOSFET". Microelectronics Reliability, vol. 45, Issue 1, Jan. 2005, pp. 19-30.*

(Continued)

*Primary Examiner*—Bret Chen
(74) *Attorney, Agent, or Firm*—Winston Hsu

(57) ABSTRACT

A method for switching decoupled plasma nitridation (DPN) processes of different doses, which is able to decrease the switching time, is provided. According to the method, a dummy wafer is inserted into a chamber, a process gas introduced is ignited into plasma, and then a DPN doping process of the next dose is performed on the dummy wafer. The nitrogen concentration of the chamber is thus adjusted rapidly to switch to the DPN process of the next dose. In addition, after several cycles of the above steps are repeated, a dummy wafer is inserted into the chamber, and a complete DPN process of the next dose is performed on the dummy wafer. This process is performed several times before switching to the next DPN process.

14 Claims, 6 Drawing Sheets

U.S. PATENT DOCUMENTS

| | | |
|---|---|---|
| 2005/0124084 A1 | 6/2005 | Shimizu et al. |
| 2005/0164523 A1* | 7/2005 | Sugawara et al. ........... 438/791 |
| 2005/0245009 A1* | 11/2005 | Bryant et al. ............... 438/151 |
| 2007/0111458 A1* | 5/2007 | Sato et al. .................. 438/308 |
| 2007/0134821 A1* | 6/2007 | Thakur et al. ................. 438/5 |

FOREIGN PATENT DOCUMENTS

| | | | |
|---|---|---|---|
| KR | 2003000575 A | * | 1/2003 |
| TW | 511215 | | 11/2002 |
| TW | I227533 | | 2/2005 |

OTHER PUBLICATIONS

Lek, Chun Meng, et al., "Impact of decoupled plasma nitridation of ultra-thin gate oxide on the performance of p-channel MOSFETs". Semiconductor Science and Technology, vol. 17 (2002), L25-L28.*

Hu, Chan-Yuan, et al., "Ultrathin decoupled plasma nitridation SiON gate dielectrics prepared with various rf powers." J. Vac. Sci. Technol. B 25(4), Jul./Aug. 2007, pp. 1298-1304.*

Tseng, H.-H., et al., "Ultra-thin decoupled plasma nitridation (DPN) oxynitride gate dielectric for 80-nm advanced technology". IEEE Electron Device Letters, vol. 23, No. 12, Dec. 2002, pp. 704-706.*

* cited by examiner

METHOD FOR SWITCHING DECOUPLED PLASMA NITRIDATION PROCESSES OF DIFFERENT DOSES

BACKGROUND OF THE INVENTION

1. Field of the Invention

The present invention is related to a method for switching decoupled plasma nitridation processes of different doses, particularly to a method for switching decoupled nitridation processes quickly.

2. Description of the Prior Art

In order to increase the integration of a single wafer, semiconductor elements are made smaller and more compact. However, for higher performance, the thickness of a gate oxide layer of a complementary metal oxide (CMOS) device is decreased to maintain the capacitance between a gate and a channel. This is because the bigger the capacitance, the smaller the electric field within the gate oxide layer, and while the electric field is small, current leakage is prevented. For example, in a semiconductor process beyond 130 nm, an oxide gate layer smaller than 20 angstroms is required to achieve good performance.

Generally, silicon oxide is used as a gate oxide layer. However, a thin layer of silicon oxide cannot meet the requirements of having a high dielectric constant, stable thermal properties, a high breakdown voltage, and small current leakage. For example, leakage currents may occur in silicon oxide layers with thickness smaller than 50 angstroms due to electrons and holes tunneling through the energy barrier of the silicon oxide layer. To fix this shortcoming, nitrogen is doped into the silicon oxide layer so as to increase the dielectric constant of the silicon oxide layer. As a result, a gate oxide layer with the same capacitance and larger physical thickness, i.e. a gate oxide layer with the same equivalent oxide thickness (EOT), is formed.

One way to dope a gate oxide layer with nitrogen is by a plasma nitridation process, such as a single step decoupled plasma nitridation (DPN) process. In a DPN process, a plasma nitridation process and an annealing process are performed to form an oxide layer with an EOT smaller than 11 angstroms. Generally, a complete DPN process includes an oxide deposition and a cooling process prior to the DPN doping process and a post nitridation annealing (PNA) process and a cooling process after the DPN. The DPN process not only decreases the current leakage efficiently, but also offers a better barrier to boron, so as to increase the performance of a transistor.

In different semiconductor device manufacture processes, the requirements of nitrogen concentration are different. However, those processes may be performed in the same chamber sequentially. Therefore, after a nitridation process is performed, the nitrogen concentration needs to be changed to fit the next nitridation process. Without a process to adjust the nitrogen concentration, the next nitridation process may be affected by the nitrogen concentration of the nitridation process just performed. This is called the memory effect. For example, after performing a 9% nitridation process, the nitrogen concentration of the chamber is too high for a 6% nitridation process, which is performed next. The unstable nitrogen concentration may affect the quality of the gate oxide and the stability of the semiconductor device.

As a result, between two nitridation processes with different doping parameters, several dummy wafers are inserted into the chamber for nitridation to adjust the nitrogen concentration of the chamber. To eliminate the memory effect, a nitrogen concentration adjusting process is provided in the prior art. According to the process, a dummy wafer is inserted to perform a complete DPN process, which includes an oxide deposition, a cooling process, a DPN doping process, a PNA and a cooling process following that. However, the adjusting process above is time consuming. In 90 nm processes, a nitrogen concentration adjusting process takes at least ten dummy wafers to recover the nitrogen concentration in the chamber. For example, in a 9% DPN process, about fifteen dummy wafers are needed to recover the nitrogen concentration of the chamber. It takes about one hour to finish nitridating fifteen dummy wafers. The higher nitrogen concentration of the DPN process, the more dummy wafers are needed. In a 13% DPN process, it takes about three to four hours to finish a nitrogen concentration adjusting process involving sixty to seventy dummy wafers. Therefore a time saving and effective method for adjusting the nitrogen concentration of the chamber is needed to meet manufacturing requirements.

SUMMARY OF INVENTION

One object of the present invention is to provide a method for adjusting the nitrogen concentration of a chamber in a short time, so as to switch one DPN process to another more quickly. Therefore, the present invention can improve the long switching time of the prior art.

According to the claim, a method for adjusting the nitrogen concentration of the chamber is disclosed, so as to switch one DPN process to another quickly. According to the method, after a complete DPN process of a first dose (nitrogen concentration) is performed, a nitrogen concentration adjusting process is performed. Following that, a complete DPN process of a second dose is performed. In the nitrogen concentration adjusting process, a dummy wafer is inserted into the chamber, and then a process gas is introduced into the chamber and ignited into plasma using RF power. The gas plasma is able to bring out the redundant nitrogen so as to adjust the nitrogen concentration of the chamber.

These and other objectives of the present invention will no doubt become obvious to those of ordinary skill in the art after reading the following detailed description of the preferred embodiment that is illustrated in the various figures and drawings.

DETAILED DESCRIPTION

A method for adjusting the nitrogen concentration of a DPN chamber, to switch a DPN process to another more quickly, is introduced for solving the problem in the prior art.

In other words, according to the present invention, the nitrogen concentration is adjusted quickly after a DPN process of a first dose, to enable the environment of the chamber to be suitable for a DPN process of a second dose.

Figure 1:
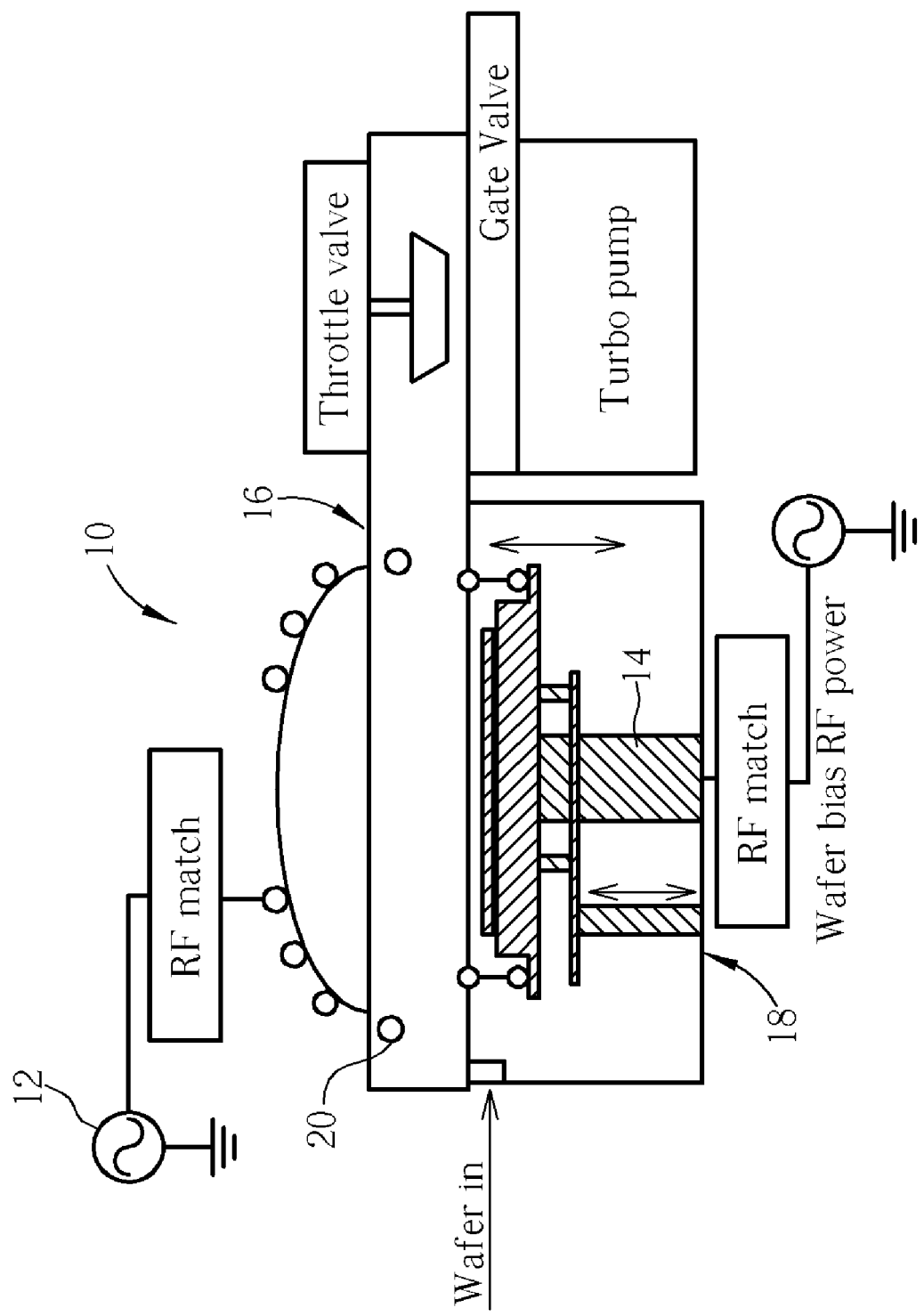
FIG. 1 is a schematic view illustrating a DPN chamber of the present invention.

Please refer to FIG. 1. FIG. 1 illustrates a DPN chamber 10 for performing the present invention. As shown in FIG. 1, a DPN chamber includes an upper chamber 16 and a lower chamber 18. There is a source of RF power 12 disposed above the upper chamber 16, to provide RF power to the DPN chamber 10. At least one gas inlet source 20 is disposed around the upper chamber 16 to introduce process gas to the DPN chamber 10. A wafer lift 14 is disposed in the lower chamber 18 to hold a wafer or a dummy wafer. However, other chambers may also be used to apply the present invention.

Figure 2:
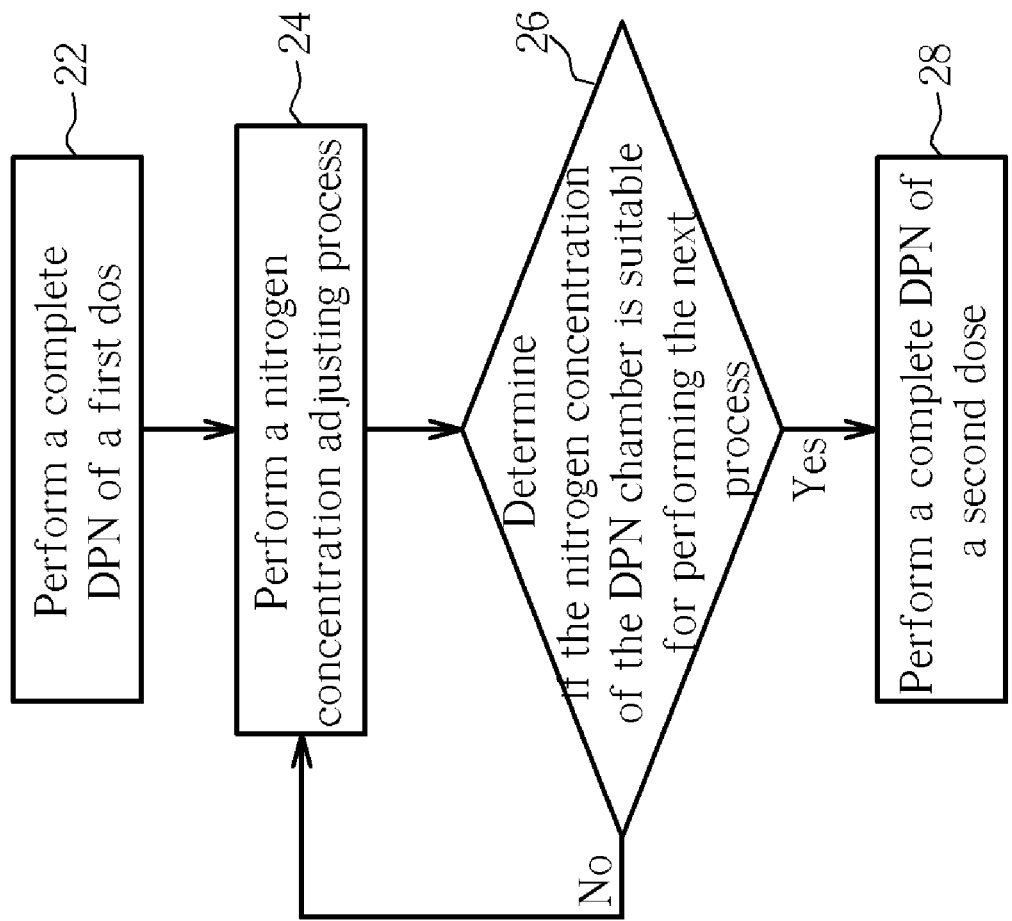
FIG. 2 is a flow chart illustrating switching DPN processes of different doses according to an embodiment of the present invention.

Please refer to FIG. 1 and FIG. 2. FIG. 2 is a flow chart illustrating an embodiment of the method for switching one DPN process to another according to the present invention. According to FIG. 2, a wafer is inserted into the lower chamber 18, to perform a complete DPN process of a first dose on it (step 22). A complete DPN process includes an oxide deposition prior to a DPN doping process, the DPN doping process, and an annealing process after the DPN doping process. A dummy wafer is then inserted into the lower chamber 18, to perform a nitrogen concentration adjusting process according to the present invention (step 24). Following that, the nitrogen concentration of the DPN chamber is measured to determine if it is suitable for performing the next process (i.e. the DPN process of a second dose) (step 26). If the nitrogen concentration of the DPN chamber is suitable for performing the next process, then the flow proceeds to the DPN process of the second dose (step 28). However, if the nitrogen concentration of the DPN chamber is not suitable for performing the next process, the nitrogen concentration adjusting process is performed again (step 24).

Figure 3:
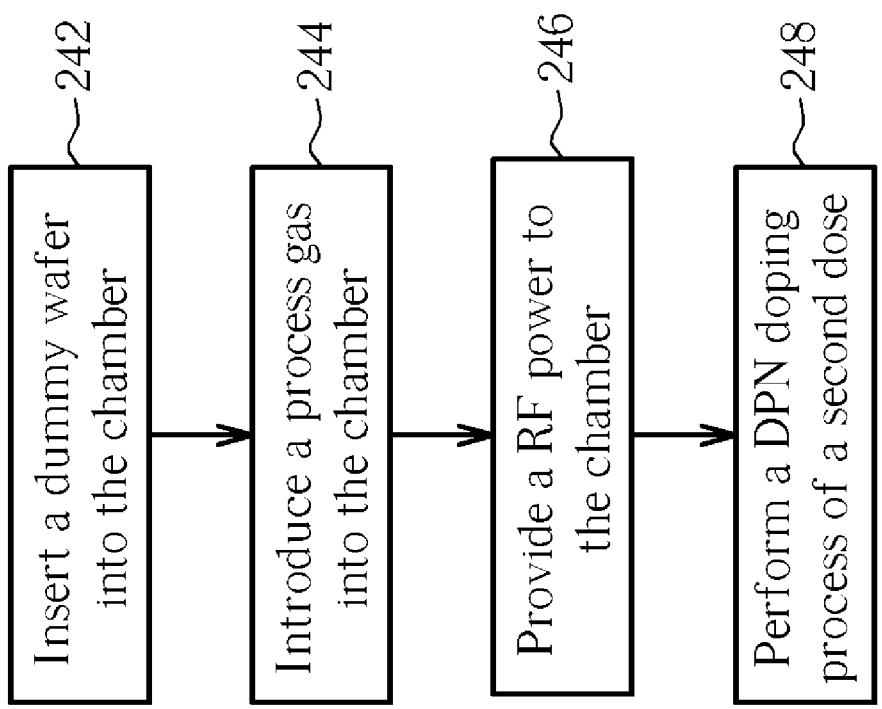
FIG. 3 is a flow chart illustrating a nitrogen concentration adjusting process according to an embodiment of the present invention.

Please refer to FIG. 1 and FIG. 3. FIG. 3 is a flow chart illustrating a nitrogen concentration adjusting process according to the present invention. According to FIG. 3, a dummy wafer is inserted into the lower chamber 18 firstly (step 242). A process gas is then introduced into the upper chamber 16 through the gas inlet sources 20 (step 244). According to the present invention, the flow rate of the process gas is in the range of 50-2000 standard cubic centimeters per minute (sccm). Following that, a power is provided to the DPN chamber 10 by the source of RF power 12, so as to ignite the process gas into plasma (step 246). According to the present invention, the power provided by the source of RF power 12 is in the range of 100-3500 watts. At last, a DPN doping process of a second dose is performed on the dummy wafer (step 248). The process time of the whole process illustrated in FIG. 3 is in the range of 15-750 seconds. However, performing the nitrogen concentration adjusting process (step 24) only one time is generally insufficient to recover the nitrogen concentration of the DPN chamber. Therefore, in addition to following the method according to FIG. 2, which involves checking the nitrogen concentration of the DPN chamber whenever a nitrogen concentration adjusting process is performed, and determining if the adjusting process needed to be performed again, the nitrogen concentration adjusting process can also optionally be performed several times directly (step 24).

However, the first dose may be higher or lower than the second dose. When the first dose is higher than the second dose, the nitrogen concentration in the DPN chamber needs to be reduced quickly. On the contrary, when the first dose is lower than the second dose, the nitrogen concentration in the DPN chamber needs to be raised quickly. Therefore, in order to make the switching of different DPN processes more efficient, the adjusting process is modified according to the relation of the first dose and the second dose.

Figure 4:
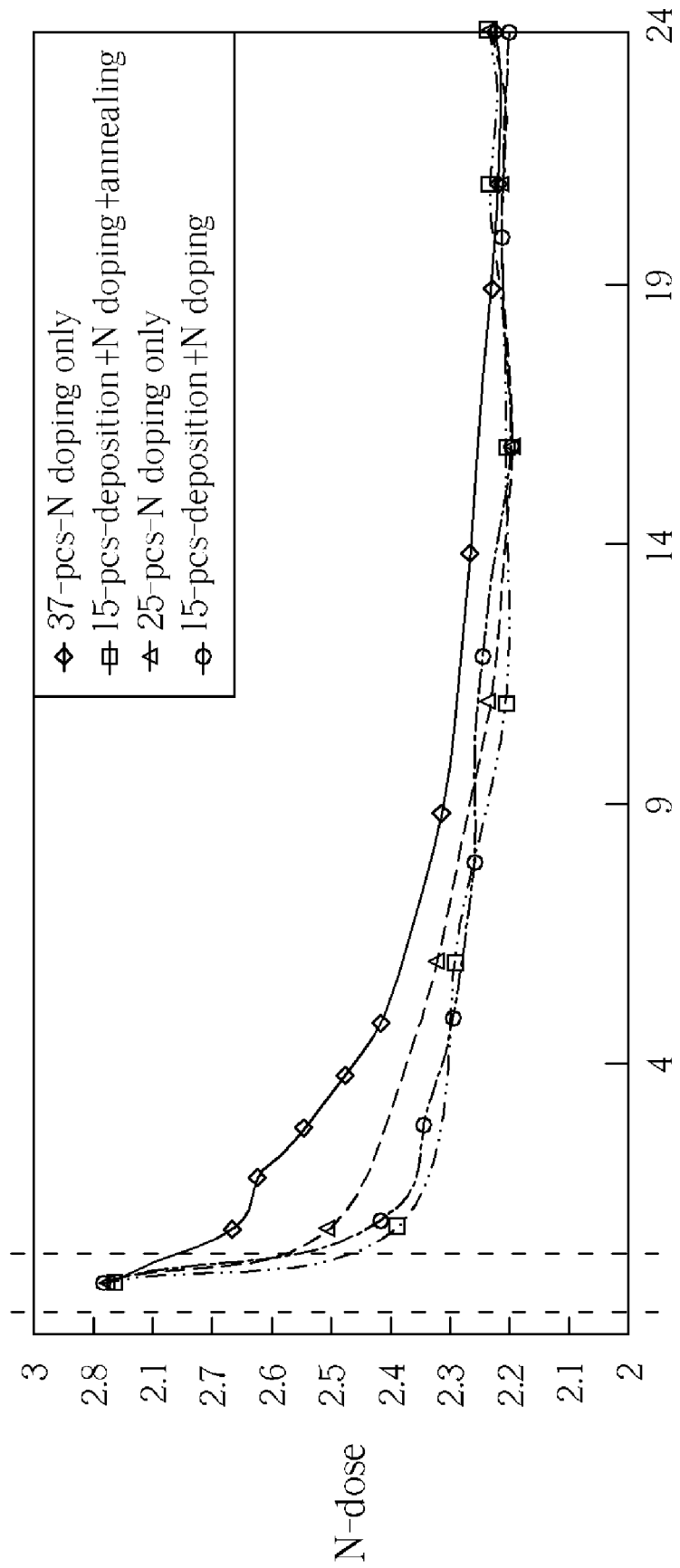
FIG. 4 is a trend graph illustrating the nitrogen dose after different nitrogen concentration adjusting processes for switching from a high dose DPN process to a low dose one.

Please refer to FIG. 2 and FIG. 4. FIG. 4 illustrates the trend of the nitrogen concentration after performing different nitrogen concentration adjusting processes on dummy wafers, which are used to switch from high dose DPN to low dose DPN. The nitrogen concentration adjusting processes are: performing DPN doping only, performing oxide deposition and DPN doping, and performing oxide deposition, DPN doping and an annealing process. According to FIG. 4, performing an oxide deposition process before the DPN doping process can reduce the nitrogen concentration in a much shorter amount of time. Therefore, in order to improve the switching time, an oxide deposition process may be performed on the dummy wafer after the complete DPN process of a first dose (step 22), when switching from a high dose DPN to a low one. In addition, due to the high temperature after the oxide deposition, a cooling process is performed after the deposition. However, proper heat effect of the dummy wafer after the oxide deposition benefits the nitrogen concentration adjusting process that follows. Therefore, the cooling process should not be too long. Generally, 20 seconds of a cooling process is appropriate.

On the contrary, while switching from a low dose DPN to a high one, the oxide deposition is not beneficial for increasing the nitrogen concentration. Therefore, the oxide deposition process is not performed when switching from low to high. In addition, the introduced process gases are used to expel the residual nitrogen, so as to decrease the nitrogen concentration rapidly. Therefore, when switching from a low DPN to a high one, the process gases may not be introduced into the DPN chamber. Compared to the prior art, the oxide deposition process and the PNA are omitted when switching from low dose DPN to high dose DPN according to the present invention. Therefore, the process demands are reduced and the result is improved. Most importantly, the switching time is significantly improved using the present method.

Figure 5:
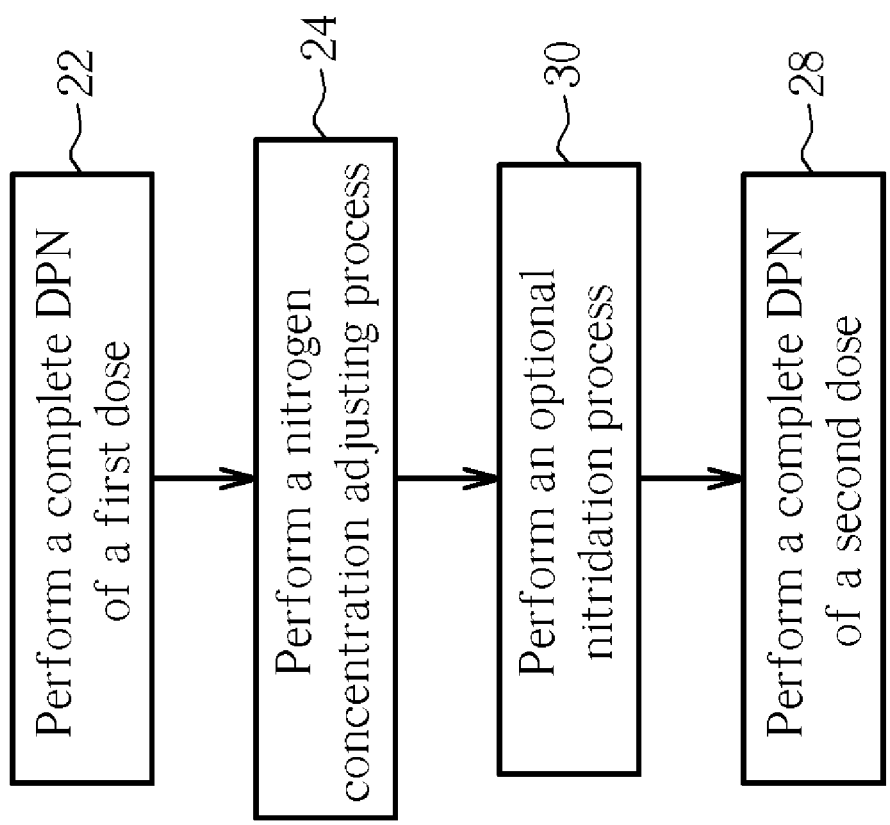
FIG. 5 is a flow chart illustrating switching DPN processes of different doses according to an embodiment of the present invention.

In addition, as shown in FIG. 5, an optional nitridation process is performed on a dummy wafer (step 30) after the nitrogen concentration adjusting process (indicated as step 24 in FIG. 2). In the nitridation process (step 30), a DPN process of the second dose is performed on the dummy wafer. For example, the DPN process of the first dose (step 22) is a 4.4% DPN process, and the DPN process of the second dose (step 26) is a 2.3% DPN process. After three cycles of nitrogen concentration adjusting process (step 24) are performed (i.e. three dummy wafers are inserted into the DPN chamber to adjust the nitrogen concentration), another ten dummy wafers are inserted into the DPN chamber to perform the 2.3% complete DPN process (including an oxide deposition process, a DPN doping process and PNA). After those processes are performed, the nitrogen concentration of the DPN chamber is suitable for performing a 2.3% DPN process. The whole process takes only 85 minutes. Compared to the conventional method, which takes 150 minutes to perform a 2.3% DPN process on 25 dummy wafers, the present invention reduces this time by about 43%. Similarly, when the DPN process of the first dose (step 22) is a 2.3% DPN process, and the DPN process of the second dose (step 26) is a 4.4% DPN process, after five cycles of nitrogen concentration adjusting process (step 24) are performed, another ten dummy wafers are inserted into the DPN chamber to perform the 4.4% complete DPN process. After those processes are performed, the nitrogen concentration of the DPN chamber is suitable for performing a 4.4% DPN process. The whole process takes only 45 minutes. Compared to the conventional method, which takes 90 minutes to perform 4.4% DPN process on 15 dummy wafers, the present invention reduces this time by about 50%.

Figure 6:
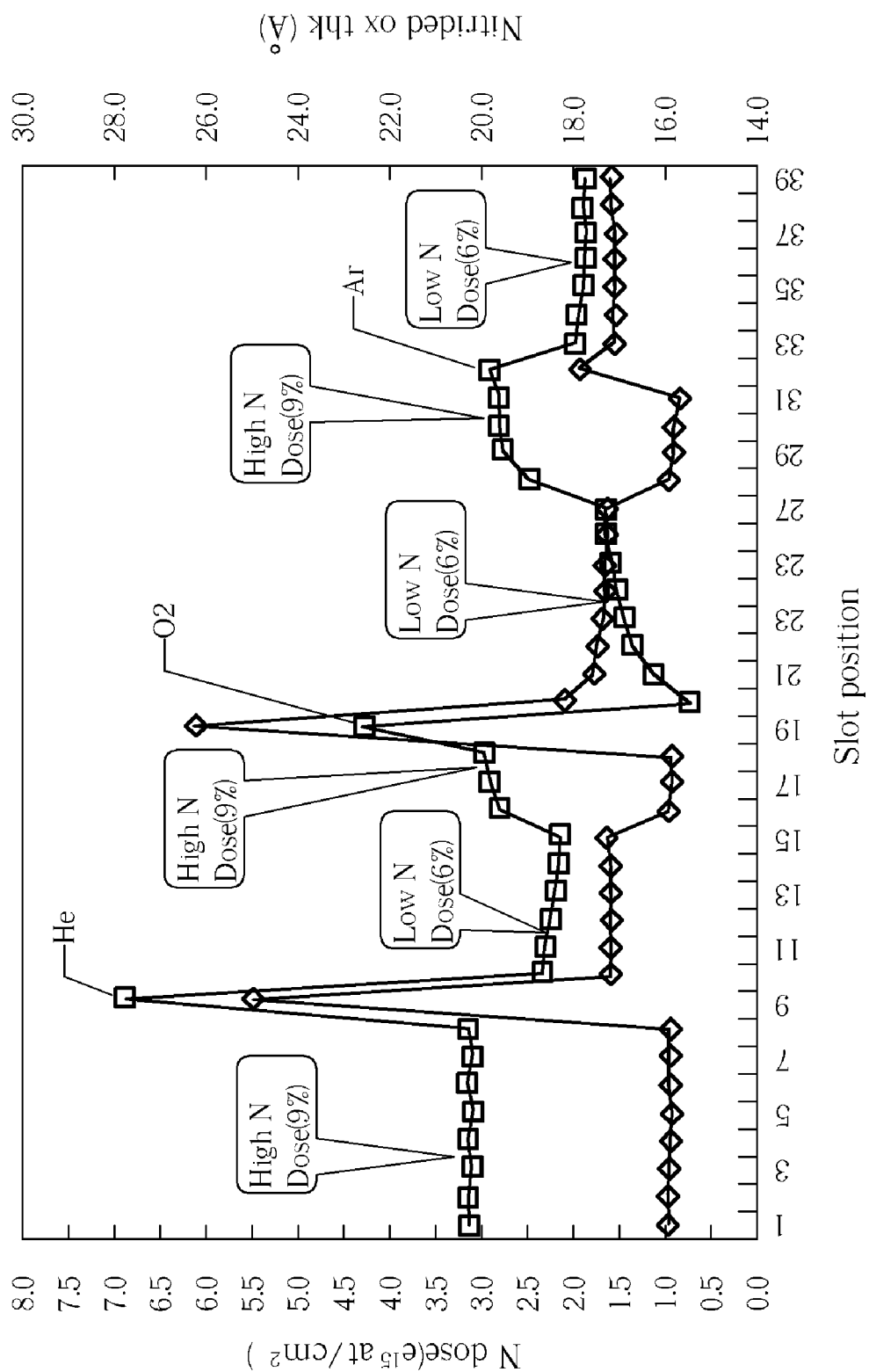
FIG. 6 is a trend graph illustrating using helium, argon, and oxygen respectively as a process gas.

It is noted that, the process gas can be helium, oxygen, or argon, but helium is preferred. Please refer to FIG. 6. FIG. 6 illustrates the change of nitrogen concentration when applying helium, oxygen, or argon to perform the present invention correspondingly. According to FIG. 6, after a 9% DPN process is performed, helium is introduced into the DPN chamber. In this case, the nitrogen concentration of the DPN chamber is dramatically raised and lowered, so as to decrease the nitrogen concentration of the DPN chamber to fit the next process, which is a 6% DPN process. Applying oxygen or argon can reach similar results. However, oxygen and argon are not as effective as helium is. In addition, those gases can be mixed in at any rate, and then applied to the process according to the requirements.

Compared to the conventional method, the present method according to the present invention is able to adjust the nitrogen concentration of the DPN chamber in a shorter time. More specifically, the present method is able to decrease the nitrogen concentration of the DPN chamber to facilitate performing the next process, which is a DPN process of a lower nitrogen concentration. In other words, using the method according to the present invention is able to solve the problem in the prior art, and increases manufacturing throughput.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for switching decoupled plasma nitridation processes of different doses, comprising:
   (a) inserting a wafer into a chamber and performing a complete decoupled plasma nitridation process of a first dose on the wafer, wherein the complete decoupled plasma nitridation process comprises an oxide deposition process, a decoupled plasma nitridation doping process, and an annealing process;
   (b) removing the wafer from the chamber;
   (c) inserting a dummy wafer into the chamber;
   (d) inserting a process gas and RF power to the chamber, and performing a decoupled plasma nitridation doping process of a second dose on the dummy wafer;
   (e) removing the dummy wafer from the chamber; and
   (f) inserting another wafer and performing a complete decoupled plasma nitridation process of the second dose on the wafer;
   wherein the dummy wafer inserted in step (c) is treated with a pre-heat process when the first dose is higher than the second dose.

2. The method of claim 1, wherein the pre-heat process is achieved by an oxide deposition process.

3. The method of claim 1, further comprising: performing a step (f1) between step (e) and step (f) to check nitrogen concentration of the chamber.

4. The method of claim 3, further comprising: performing a nitrogen concentration adjusting process, which comprises repeating step (e) to step (f1) at least once.

5. The method of claim 1, further comprising: inserting a second dummy wafer into the chamber, and performing a complete decoupled plasma nitridation process of the second dose on the second dummy wafer before performing step (f).

6. The method of claim 1, wherein the process gas is helium, argon, oxygen, or any mix of the above.

7. The method of claim 1, wherein the flow rate of the process gas is 50-2000 standard cubic centimeters per minute (sccm).

8. The method of claim 1, wherein the range of the RF power is between 100-3000 watts.

9. The method of claim 1, wherein the time range for performing steps (b), (c) and (d) is between 15-750 seconds.

10. A method for switching from a low dose decoupled plasma nitridation process to a high dose decoupled plasma nitridation process, comprising:
    (a) inserting a wafer into a chamber and performing a complete low dose decoupled plasma nitridation process on the wafer, wherein the complete decoupled plasma nitridation process comprises an oxide deposition process, a decoupled plasma nitridation doping process, and an annealing process;
    (b) removing the wafer from the chamber;
    (c) inserting a dummy wafer into the chamber;
    (d) performing a high dose decoupled plasma nitridation doping process on the dummy wafer;
    (e) removing the dummy wafer from the chamber; and
    (f) inserting another wafer to perform a high dose complete decoupled plasma nitridation process on the wafer.

11. The method of claim 10, further comprising: performing a step (f1) between step (e) and step (f) to check nitrogen concentration of the chamber.

12. The method of claim 11, further comprising: performing a nitrogen concentration adjusting process, which comprises repeating step (e) to step (f1) at least once.

13. The method of claim 10, further comprising: inserting a second dummy wafer into the chamber, and performing a complete high dose decoupled plasma nitridation process on the second dummy wafer before performing step (f).

14. The method of claim 10, wherein the time range for performing steps (b), (c) and (d) is between 15-750 seconds.

* * * * *